(12) United States Patent
Schroeter et al.

(10) Patent No.: US 7,170,354 B2
(45) Date of Patent: Jan. 30, 2007

(54) OSCILLATOR CIRCUIT WITH LASER-TRIMMABLE LOAD IMPEDANCE

(75) Inventors: Holger Schroeter, Munich (DE); Ingo Skuras, Munich (DE)

(73) Assignee: Tyco Electronics Raychem GmbH, Ottobrunn (DE)

( * ) Notice: Subject to any disclaimer, the term of this patent is extended or adjusted under 35 U.S.C. 154(b) by 66 days.

(21) Appl. No.: 10/741,495

(22) Filed: Dec. 19, 2003

(65) Prior Publication Data
US 2004/0189411 A1    Sep. 30, 2004

(30) Foreign Application Priority Data
Dec. 19, 2002   (EP)   ................... 02028194

(51) Int. Cl.
*H03L 7/00*   (2006.01)
(52) U.S. Cl. ....................... 331/16; 331/36 R
(58) Field of Classification Search ............ 331/16–17, 331/34–36 R, 36 C, 44, 72, 107 SL, 94.1
See application file for complete search history.

(56) References Cited
U.S. PATENT DOCUMENTS

| | | | |
|---|---|---|---|
| 4,095,199 A | 6/1978 | Behn et al. | 333/167 |
| 4,749,963 A * | 6/1988 | Makimoto et al. | 331/99 |
| 5,264,983 A | 11/1993 | Petrinec | |
| 6,201,458 B1 * | 3/2001 | Matsuo et al. | 333/204 |
| 6,604,266 B1 * | 8/2003 | Tajima et al. | 29/25.35 |

OTHER PUBLICATIONS

Johanson Technology "LASERtrim Tuning Application Notes" (1998) pp. 10-13.

* cited by examiner

*Primary Examiner*—Timothy P. Callahan
*Assistant Examiner*—Cassandra Cox
(74) *Attorney, Agent, or Firm*—Barley Snyder LLC

(57) ABSTRACT

An oscillator circuit for generating signals with a predetermined oscillator frequency is provided. The oscillator circuit has at least one resonator and at least one load impedance connected to the resonator. The oscillator circuit may be fully automatically trimmed and economically produced and, moreover, is of an improved quality wherein the load impedance comprises at least one structure which may be machined by means of high-energy radiation to trim the resonant characteristics of the oscillator circuit.

3 Claims, 3 Drawing Sheets

OSCILLATOR CIRCUIT WITH LASER-TRIMMABLE LOAD IMPEDANCE

FIELD OF THE INVENTION

The present invention relates to an oscillator circuit for generating signals with a predetermined oscillator frequency and to a method for trimming the resonant characteristics of an oscillator.

BACKGROUND OF THE INVENTION

Stable signals with precisely specified constant frequencies are required in many applications including microprocessor technology, video applications and telecommunications. A very precise, constant output reference frequency is particularly essential in the context of voltage-controlled oscillators (VCOs) and especially voltage-controlled crystal oscillators (VCXOs), which are frequently used for example in mobile communications as part of a phase locked loop (PLL). Such PLLs supply the carrier frequency, for example, which is required as input signal for mixers.

For example in base stations of digital networks, the reference oscillator constitutes a core component, which has on the one hand to meet extremely stringent conditions with regard to accuracy and stability while on the other hand being capable of manufacture in large numbers and at the lowest possible cost.

To achieve the required accuracies, trimming is often necessary. The alternative option of using very tight-tolerance components makes the oscillator circuit very expensive. Mechanical trimming can only be automated to a certain degree, and may result in a reduction in the quality of the oscillating circuit.

In addition to mechanical trimming by grinding of resonators, conductor trace elements or the like or bending of air-core coils to adjust the parameters of an oscillator circuit, it is also known to machine resonators by means of high-energy radiation, such as laser radiation for example, to adjust the oscillator parameters. Trimming of a capacitor constituting part of an oscillator circuit is disclosed in U.S. Pat. No. 4,095,199, for example.

A method of trimming capacitors is disclosed in U.S. Pat. No. 5,264,983. The method includes providing a monolithic capacitor with a top electrode, a part of which may be removed by high-energy radiation, such as for example laser radiation. The particular advantage of this procedure is that the laser device may be actuated fully automatically as a function of the capacitance values achieved. In addition, markedly more accurate trimming may be achieved than with a conventional mechanical method. This is clear for example from the Johanson Technology website, http://www.johansontechnoloy.com/products/lzc/index.htm where a trimmable capacitor is used as a resonant element in a resonant circuit.

However, known solutions for automatic trimming of the resonant characteristics of an oscillator circuit have the problem that the use of trimmable components in the actual resonant circuit generally results in a marked reduction in the quality of the resonant circuit.

SUMMARY OF THE INVENTION

An object of the present invention is therefore to provide an oscillator circuit which may be automatically trimmed and economically produced and, moreover, is of an improved quality.

This and other objects are achieved by an oscillator circuit having a load impedance having a structure which is machined by means of high-energy radiation, such that trimming may be performed automatically.

BRIEF DESCRIPTION OF THE DRAWINGS

The invention is explained more fully below with reference to the embodiments illustrated in the attached drawings. Similar or corresponding details are provided with identical reference numerals in the Figures. In the Figures.

DETAILED DESCRIPTION OF THE INVENTION

Figure 1:
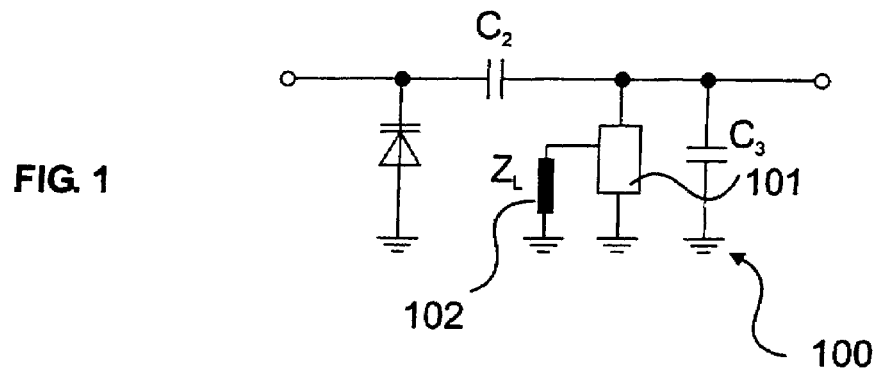
FIG. 1 is a circuit diagram of an oscillator circuit according to an embodiment of the invention.

FIG. 1 shows the circuit diagram of an oscillator circuit 100, as may be used for example for a frequency synthesiser for cell phone base stations. Such modules generate the clock rates for the transmit and receive sections of cell phone base stations. Such a circuit may be constructed for example as an SMD-equipped printed circuit board with or without a metal cap.

Figure 5:
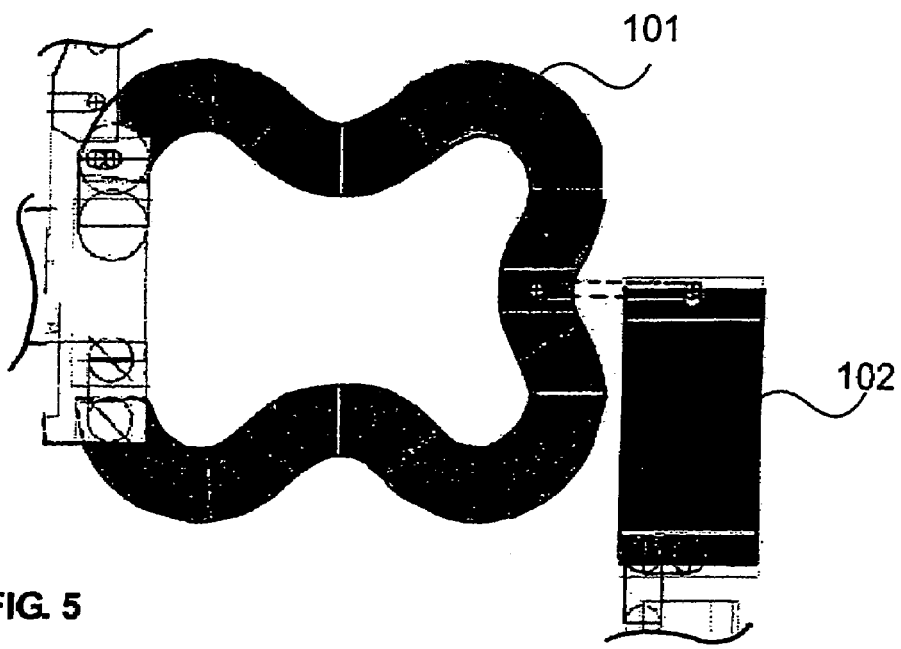
FIG. 5 shows the layout of part of an oscillator circuit with a laser-trimmable capacitor.

According to the embodiment shown in FIG. 1, a resonator 101 in the form of a conductor trace structure, as illustrated for example in FIG. 5, is used as a frequency-determining element. A load impedance $Z_L$ 102 is coupled to this resonator 101 as a load. In this embodiment, the elements directly determine the quality of the resonant circuit, namely the resonator 101 and the capacitors $C_2$ and $C_3$. Therefore high-quality invariable components are selected for these elements. Varying the load impedance 102 utilizing laser machining may however, compensate variations in the parameters of these components.

Figure 2:
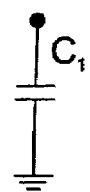
FIG. 2 is a circuit diagram of a load impedance according to a first embodiment of the invention.
Figure 3:
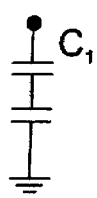
FIG. 3 is a circuit diagram of a load impedance according to a second embodiment of the invention.
Figure 4:
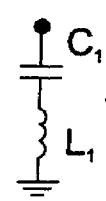
FIG. 4 is a circuit diagram of a load impedance according to a third embodiment of the invention.

FIGS. 2 to 4 show examples of possible load impedances $Z_L$ that may be varied by laser machining. As an alternative, however, machining of an inductor $L_1$ or of a resistor, not shown in the Figures, may also be provided.

As shown in FIG. 5, the resonator 101 may be a looped structure. The connection for the trimmable load impedance 102 is arranged at the point selected with regard to trimming area and quality.

Figure 6:
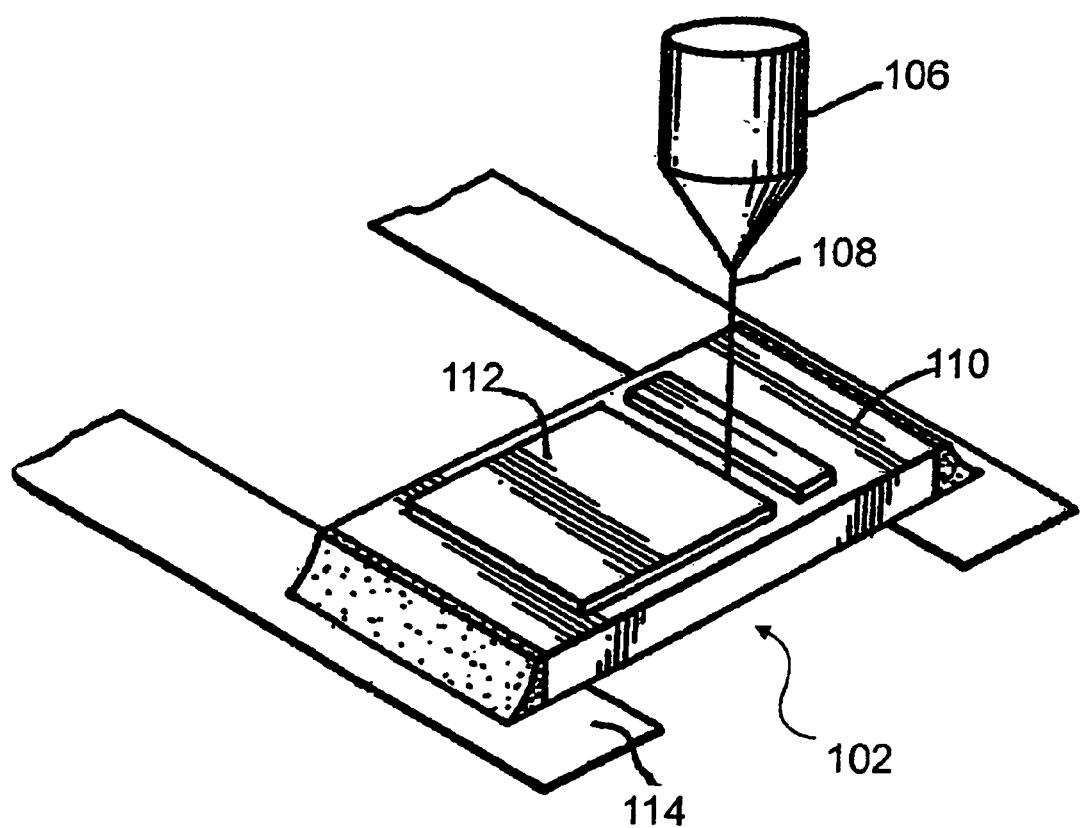
FIG. 6 is a perspective representation of the load capacitor during the process of trimming by laser radiation.

The load impedance 102 may, as shown in FIG. 2, be a surface mounted monolithic capacitor in which various inner electrodes are embedded in a dielectric 110. FIG. 6 is a perspective representation of such a capacitor. A top electrode 112 is arranged in such a way that it may be machined by a laser beam 108, which is guided by a computer-controlled machining unit 106. Laser radiation, for example by a computer-controlled YAG laser beam, is particularly suitable for such machining of the electrically conductive structures of a load impedance such as the load impedance 102. Conductor traces 114 connect the load impedance 102 with the oscillator circuit 100 of FIG. 1.

If the oscillator circuit is to be trimmed, it is connected to a measuring instrument. The laser beam 108 may be actuated as a function of the measured resonant characteristics of the oscillator circuit, for example the resonant frequency, in order to remove further parts of the top electrode 112. The advantage of this procedure is that trimming may be performed fully automatically. However, since the laser-trimmable load impedance 102 is merely a load capacitor, the quality of the actual resonant circuit is impaired only insignificantly by the trimmable element.

Figure 7:
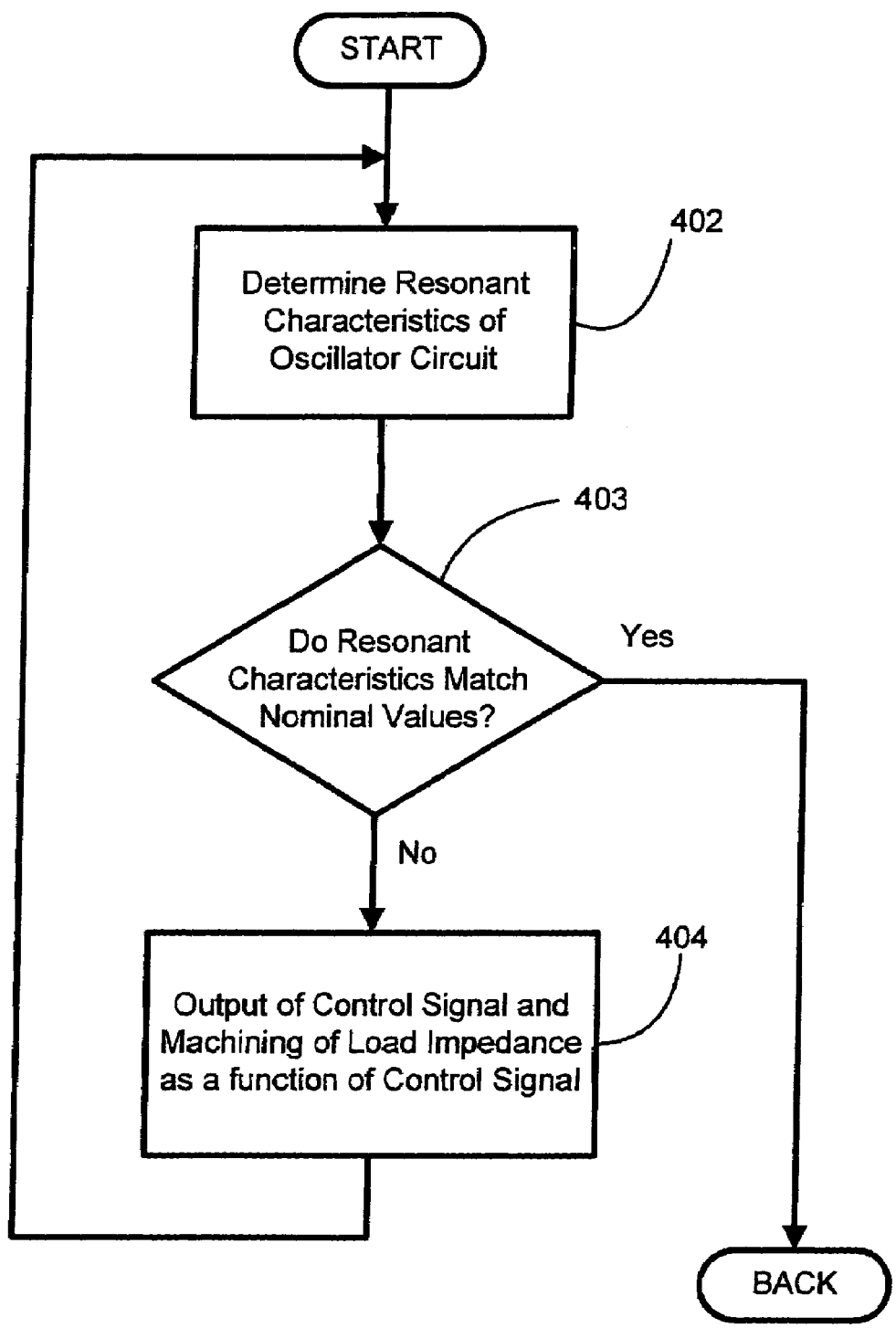
FIG. 7 is a flowchart of the process of trimming an oscillator circuit according to the present invention.

FIG. 7 is a flowchart showing trimming of the resonant characteristics of the oscillator. A first step 402 comprises determination of the resonant characteristics of a basic structure of the oscillator with at least one resonator and at least one load impedance, for example a trimmable capacitor. The trimmable capacitor has a top electrode, which is large enough to ensure the maximum capacitance necessary.

In the next step 403, the resonant characteristics determined are compared with predetermined nominal values and a decision is made as to whether the measured resonant characteristics match the predetermined nominal characteristics. Depending on the result of this comparison, either further erosion of the top electrode is performed, by returning to step 402 of the process, or the trimming process is terminated.

As an alternative to the laser machining of a load capacitor described in detail, it is of course possible, according to the present invention, to machine any other type of load impedance, e.g. an inductor, a resistor or a combination of inductive, resistive and capacitive impedances, by means of high-energy radiation.

By machining the electrodes of a capacitor, the capacitance and thus the total effective load impedance may advantageously be modified in a particular effective manner by the erosion of material. As an alternative, however, a laser-trimmable coil or a laser-trimmable resistor may be provided in the load impedance.

If the capacitor comprises a monolithic base member of a dielectric material and the electrically conductive structure takes the form of at least one electrode arranged on an externally accessible surface of the base member, the entire circuit may be particularly compact.

If the load impedance takes the form of a surface-mountable component (Surface Mounted Device, SMD), a particularly compact, cost-effective oscillator circuit construction may be achieved.

Particularly high quality may be achieved if the resonator takes the form of a stripline. The resonator may be looped, for example, to save space or to optimise arrangement of the components.

By suitable selection of the position of the load impedance tap on the resonator, it is possible to achieve an optimum combination of trimming area and oscillating circuit quality.

What is claimed is:

1. A method of trimming the resonant characteristics of an oscillator, comprising the steps of:
    determining the resonant characteristics of an oscillator with at least one looped stripline resonator and at least one load impedance;
    comparing the determined resonant characteristics with predetermined nominal characteristics;
    generating a control signal as a function of the result of the comparison and output of the control signal to a machining device; and
    machining the load impedance as a function of the control signal.

2. The method according to claim 1, wherein the machining unit comprises a laser.

3. The method according to claim 1, wherein the step of machining the load impedance as a function of the control signal comprises removal of at least part of an electrode of a capacitor.

* * * * *